(12) United States Patent
Cheng

(10) Patent No.: US 10,289,155 B2
(45) Date of Patent: May 14, 2019

(54) DISPLAY SCREEN ASSEMBLY, METHOD FOR ASSEMBLING DISPLAY SCREEN ASSEMBLY AND ELECTRONIC DEVICE

(71) Applicant: GUANGDONG OPPO MOBILE TELECOMMUNICATIONS CORP., LTD., Dongguan (CN)

(72) Inventor: Jiao Cheng, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/707,130

(22) Filed: Sep. 18, 2017

(65) Prior Publication Data

US 2018/0197463 A1    Jul. 12, 2018

(30) Foreign Application Priority Data

Jan. 9, 2017  (CN) .......................... 2017 1 0013754
Jan. 9, 2017  (CN) ...................... 2017 2 0022587 U

(51) Int. Cl.
*G06F 1/16*    (2006.01)
*H04M 1/02*    (2006.01)
(Continued)

(52) U.S. Cl.
CPC ........... *G06F 1/1626* (2013.01); *G02B 6/009* (2013.01); *G06F 1/1603* (2013.01);
(Continued)

(58) Field of Classification Search
CPC ....... G02F 2001/133325; G06F 1/1637; G06F 3/0412; H04M 1/185
See application file for complete search history.

(56) References Cited

U.S. PATENT DOCUMENTS

2006/0060732 A1 *  3/2006  Tannas, Jr. ............. B60K 35/00
                                                                    248/205.1
2011/0005662 A1 *  1/2011  Sung ....................... G06F 3/044
                                                                    156/153
(Continued)

FOREIGN PATENT DOCUMENTS

CN    104199206 A    12/2014
CN    104464521 A     3/2015
(Continued)

OTHER PUBLICATIONS

Chinese Patent Application No. 201710013754.4 English translation of First Office Action dated Apr. 28, 2018, 10 pages.
(Continued)

*Primary Examiner* — Sanjiv D. Patel
(74) *Attorney, Agent, or Firm* — Lathrop Gage LLP

(57) ABSTRACT

A display screen assembly, a method for assembling display screen assembly and an electronic device are provided. The display screen assembly includes: a display screen having a display area and a non-display area surrounding the display area, a connector, a cover plate and a bracket. The connector includes a first joining portion, a second joining portion and a third joining portion. The first joining portion is coupled in the non-display area. The second joining portion is opposite to a side wall of the display screen. The third joining portion is fitted with a bottom surface of the display screen and corresponds to the non-display area. A lower surface of the cover plate is positioned to the top surface of the display screen and the first joining portion. The bracket includes a top portion joined to the bottom surface of the display screen and the third joining portion.

19 Claims, 15 Drawing Sheets

(51) Int. Cl.
*F21V 8/00* (2006.01)
*G06F 3/041* (2006.01)
*H01L 27/32* (2006.01)
*G02F 1/1333* (2006.01)
*H04M 1/18* (2006.01)
*G09G 3/3208* (2016.01)

(52) U.S. Cl.
CPC .......... *G06F 1/1637* (2013.01); *G06F 1/1643* (2013.01); *G06F 3/0416* (2013.01); *H01L 27/323* (2013.01); *H04M 1/0266* (2013.01); *G02F 2001/133325* (2013.01); *G06F 3/0412* (2013.01); *G09G 3/3208* (2013.01); *H04M 1/185* (2013.01)

(56) References Cited

U.S. PATENT DOCUMENTS

| | | | | |
|---|---|---|---|---|
| 2011/0006999 | A1* | 1/2011 | Chang | G06F 3/044 345/173 |
| 2012/0135247 | A1* | 5/2012 | Lee | G06F 3/041 428/426 |
| 2013/0222298 | A1* | 8/2013 | Kato | G06F 3/01 345/173 |
| 2013/0329460 | A1* | 12/2013 | Mathew | H05K 5/02 362/612 |
| 2014/0265821 | A1* | 9/2014 | Malon | H05B 33/22 313/504 |
| 2015/0331451 | A1* | 11/2015 | Shin | G06F 3/041 345/173 |
| 2016/0018692 | A1 | 1/2016 | Park | |
| 2016/0227654 | A1 | 8/2016 | Kim et al. | |
| 2016/0234362 | A1* | 8/2016 | Moon | H04M 1/0202 |

FOREIGN PATENT DOCUMENTS

| | | |
|---|---|---|
| CN | 204462580 U | 7/2015 |
| CN | 104915064 A | 9/2015 |
| CN | 104965612 A | 10/2015 |
| CN | 204833094 U | 12/2015 |
| CN | 105278158 A | 1/2016 |
| CN | 106843386 A | 6/2017 |
| CN | 106843387 A | 6/2017 |
| CN | 206411567 U | 8/2017 |

OTHER PUBLICATIONS

Chinese Patent Application No. 201710013754.4 First Office Action dated Apr. 28, 2018, 9 pages.
European Patent Application No. 17192953.2 extended Search and Opinion dated May 3, 2018, 9 pages.
PCT/CN2017/102260 English translation of the International Search Report and Written Opinion dated Dec. 26, 2017, 12 pages.

* cited by examiner

DISPLAY SCREEN ASSEMBLY, METHOD FOR ASSEMBLING DISPLAY SCREEN ASSEMBLY AND ELECTRONIC DEVICE

CROSS-REFERENCE TO RELATED APPLICATIONS

This application claims priority to and benefits of Chinese Patent Application Nos. 201720022587.5 and 201710013754.4, filed with State Intellectual Property Office on Jan. 9, 2017, the entire content of which is incorporated herein by reference.

FIELD

The present disclosure relates to a technical field of electronic devices, and particularly to a display screen assembly, a method for assembling display screen assembly and an electronic device.

BACKGROUND

With developments of technologies, smart phones are used more and more widely and have more and more functions, and hence have become necessary electronic devices in people's daily lives. At present, a large display area of a mobile phone can better meet users' requirements of browsing webpages, reading, watching films, playing games and so on. Accordingly, the current smart phone has a larger screen, and a full-screen phone comes into being. The full-screen phone employs a flexible screen, and a cover plate joined to the flexible screen will pull the flexible screen when the phone falls down, thus causing the flexible screen to be delaminated and cracked easily.

SUMMARY

According to a first aspect of embodiments of the present disclosure, there is provided a display screen assembly. The display screen assembly includes a display screen, a connector, a cover plate and a bracket. The display screen includes a display area and a non-display area surrounding the display area. The connector includes a first joining portion, a second joining portion bending from an edge of the first joining portion, and a third joining portion bending from the second joining portion. The first joining portion is coupled a top surface of the display screen and located in the non-display area of the display screen, and the display area is exposed out of the first joining portion. The second joining portion is opposite to a side wall of the display screen, and the third joining portion is fitted with a bottom surface of the display screen and corresponds to the non-display area. The cover plate has a lower surface positioned to the top surface of the display screen and to the first joining portion. The bracket includes a top portion joined to the bottom surface of the display screen and to the third joining portion.

According to a second aspect of embodiments of the present disclosure, there is provided a method for assembling a display screen assembly. The method includes:

providing a display screen, a connector, a cover plate and a bracket, the display screen including a display area and a non-display area, and the connector including a first joining portion, a second joining portion, and a third joining portion;

coupling the first joining portion to a lower surface of the cover plate;

positioning the lower surface of the cover plate to a top surface of the display screen;

coupling the first joining portion in the non-display area of the display screen and exposing the display area out of the first joining portion;

bending the second joining portion to a side wall of the display screen, such that the second joining portion is opposite to the side wall of the display screen;

bending the third joining portion to a bottom surface of the display screen, such that the third joining portion is corresponding to the non-display area;

coupling the bottom surface of the display screen to a top portion of the bracket; and coupling the third joining portion to the top portion of the bracket.

According to a third aspect of embodiments of the present disclosure, there is provided an electronic device. The electronic device includes a rear cover and a display screen assembly coupled to the rear cover to define an accommodating space therebetween. The display screen assembly includes:

a display screen having a display area and a non-display area;

a connector having a first joining portion, a second joining portion bending from an edge of the first joining portion, and a third joining portion bending from the second joining portion, the first joining portion being coupled in the non-display area of the display screen, the second joining portion being opposite to a side wall of the display screen, and the third joining portion being fitted with a bottom surface of the display screen and corresponding to the non-display area;

a cover plate having a lower surface positioned to the top surface of the display screen and to the first joining portion; and a bracket having a top portion joined to the bottom surface of the display screen and to the third joining portion.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and/or additional aspects and advantages of embodiments of the present disclosure will become apparent and more readily appreciated from descriptions made with reference to following drawings.

DETAILED DESCRIPTION

Figure 1:
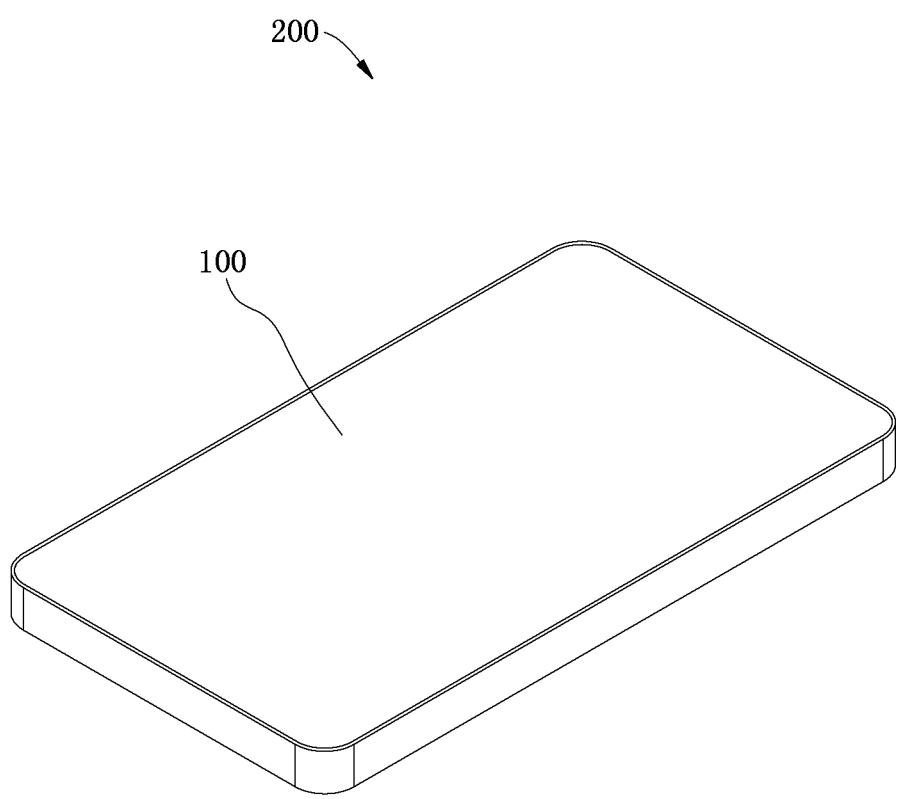
FIG. 1 is a perspective view of an electronic device according to an embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In the specification, it is to be understood that terms such as "central", "longitudinal", "lateral", "length", "width", "thickness", "upper", "lower", "front", "rear", "left", "right", "vertical", "horizontal", "top", "bottom", "inner", "outer", "clockwise" and "counterclockwise" should be construed to refer to the orientation as then described or as shown in the drawings under discussion. These relative terms are for convenience of description and do not require that the present disclosure be constructed or operated in a particular orientation. In addition, terms such as "first" and "second" are used herein for purposes of description and are not intended to indicate or imply relative importance or significance or to imply the number of indicated technical features. Thus, the feature defined with "first" and "second" can comprise one or more of this feature. In the description of the present disclosure, the term "a plurality of" means two or more than two, unless specified otherwise.

In the present disclosure, unless specified or limited otherwise, the terms "mounted", "connected", "fixed" are used broadly, and can be, for example, fixed connections, detachable connections, or integral connections; can also be mechanical or electrical connections; can also be direct connections or indirect connections via intervening structures; can also be inner communications of two elements, which can be understood by those skilled in the art according to specific situations.

In the present disclosure, unless specified or limited otherwise, a structure in which a first feature is "on" or "below" a second feature can include an embodiment in which the first feature is in direct contact with the second feature, and can also include an embodiment in which the first feature and the second feature are not in direct contact with each other, but are contacted via an additional feature formed therebetween. Furthermore, a first feature "on", "above" or "on top of" a second feature can include an embodiment in which the first feature is right or obliquely "on", "above" or "on top of" the second feature, or just means that the first feature is at a height higher than that of the second feature; while a first feature "below", "under" or "on bottom of" a second feature can include an embodiment in which the first feature is right or obliquely "below", "under" or "on bottom of" the second feature, or just means that the first feature is at a height lower than that of the second feature.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals can be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials can be also applied.

Figure 2:
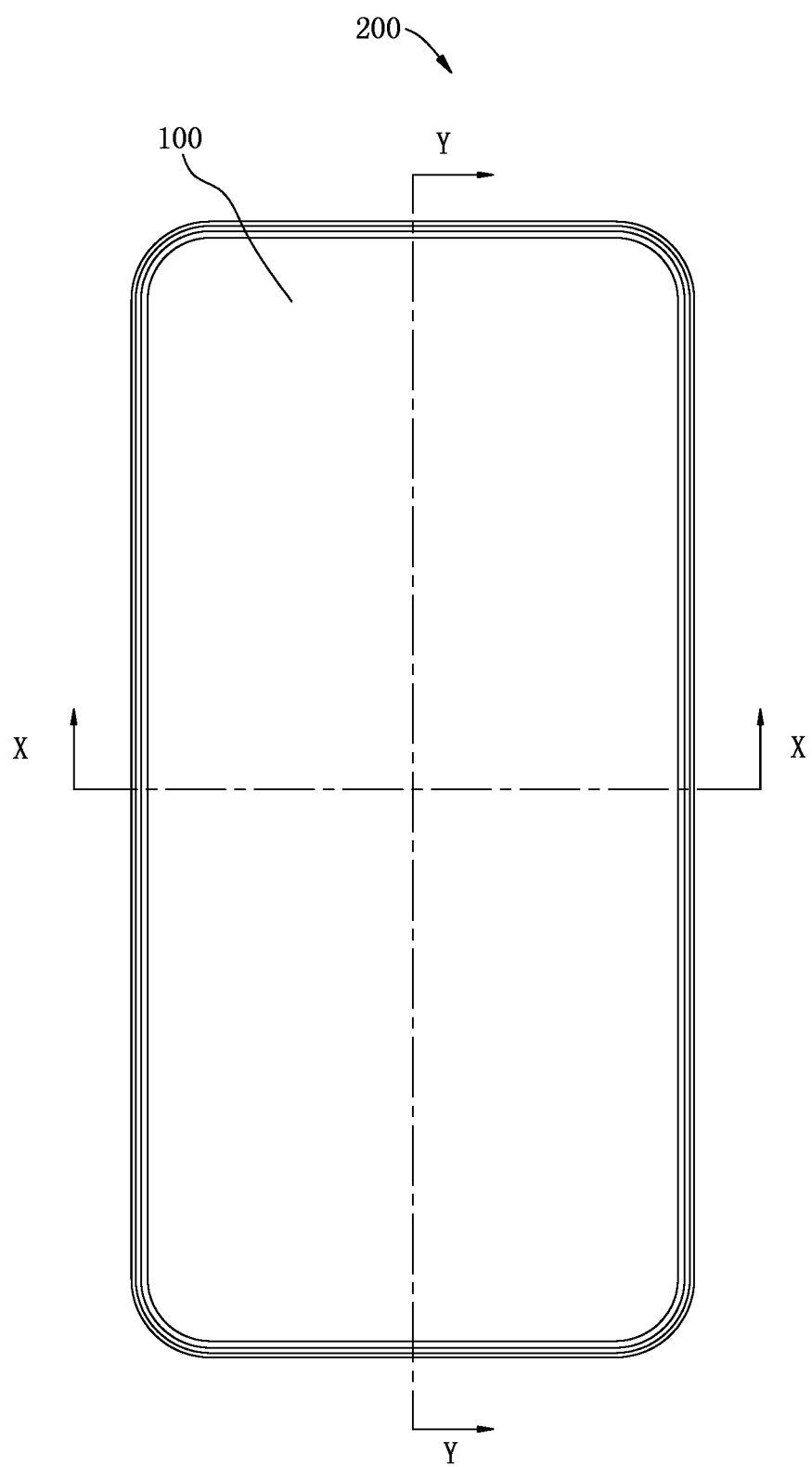
FIG. 2 is a plan view of an electronic device according to an embodiment of the present disclosure.

As illustrated in FIG. 1 and FIG. 2, an electronic device 200 according to embodiments of the present disclosure includes a display screen assembly 100. The electronic device 200 can be a mobile phone, a tablet computer, a smart watch or the like. In the embodiments, the mobile phone is taken as an example of the electronic device 200 for explanations.

Figure 3:
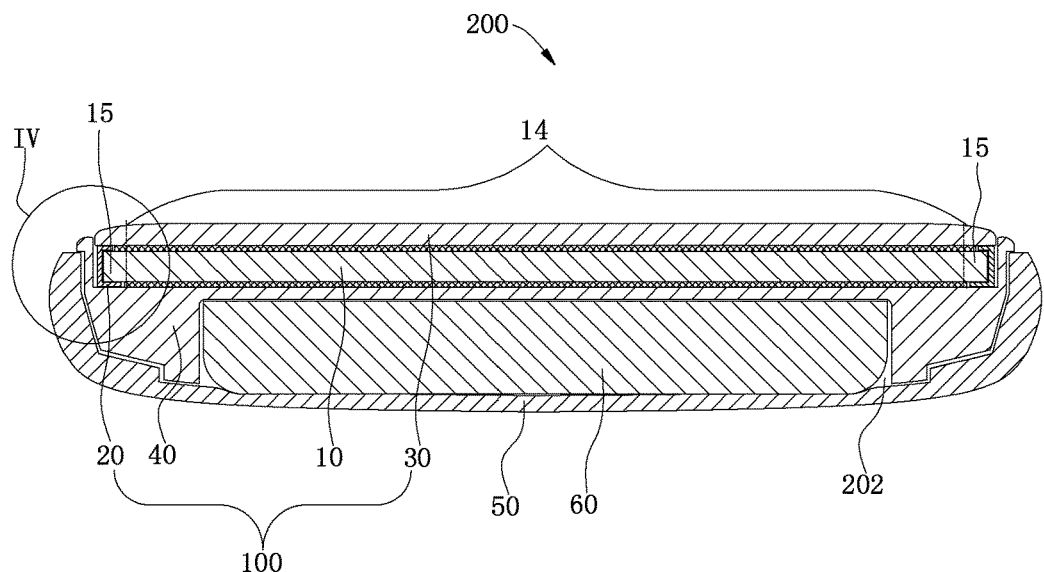
FIG. 3 is a sectional view of an electronic device according to an embodiment of the present disclosure taken along line X-X or line Y-Y in FIG. 2.

As illustrated in FIG. 2 to FIG. 3, the display screen assembly 100 is configured to display images and texts and also configured to receive touch operations from users. The display screen assembly 100 includes a display screen 10, a connector 20, a cover plate 30 and a bracket 40.

Figure 4:
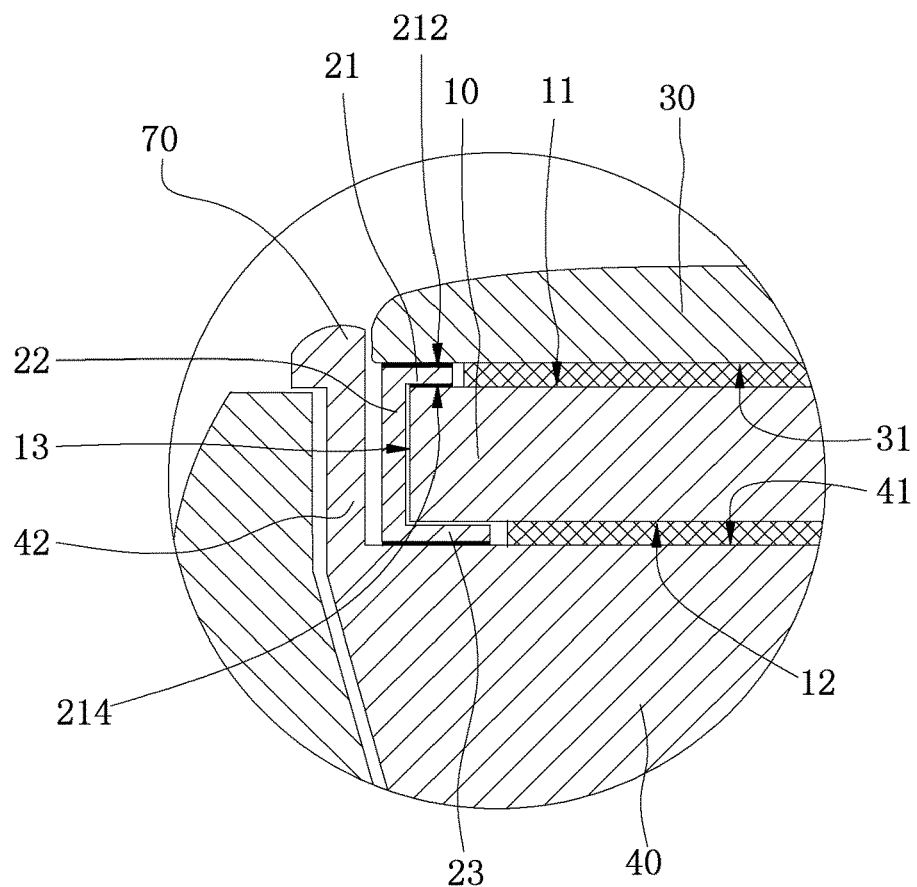
FIG. 4 is a partially enlarged view of portion IV in FIG. 3.

As illustrated in FIG. 3 to FIG. 4, a sectional view illustrated in FIG. 3 can be a sectional view of the electric device 200 taken along direction X-X or direction Y-Y in FIG. 2. The display screen 10 is configured as a rectangular block in shape and includes a top surface 11, a bottom surface 12 and a side wall 13. The top surface 11 is opposite to the bottom surface 12, the side wall 13 connects the top surface 11 with the bottom surface 12, and the side wall 13 is substantially perpendicular to the top surface 11 and the bottom surface 12. The display screen 10 includes a display area 14 and a non-display area 15. The display area 14 is substantially rectangular in shape and located in middle of the top surface 11 of the display screen 10, and the display area 14 is configured to display images, videos, texts or the like information. The non-display area 15 is located at a periphery of the top surface 11 of the display screen 10 and surrounds the display area 14, and the non-display area 15 is in a shape of "回". In some embodiments, the non-display area 15 is in the shape of elongated "回". In other words, the non-display area 15 has a shape of a rectangle whose central portion is removed to provide a concentric through groove. In the embodiments of the present disclosure, the display screen 10 can be an organic light-emitting diode (OLED) flexible screen. The display screen 10 is composed of multiple layers. For example, the display screen 10 includes a negative plate, an organic light-emitting layer, a positive plate, a polarizer and so on.

Figure 5:
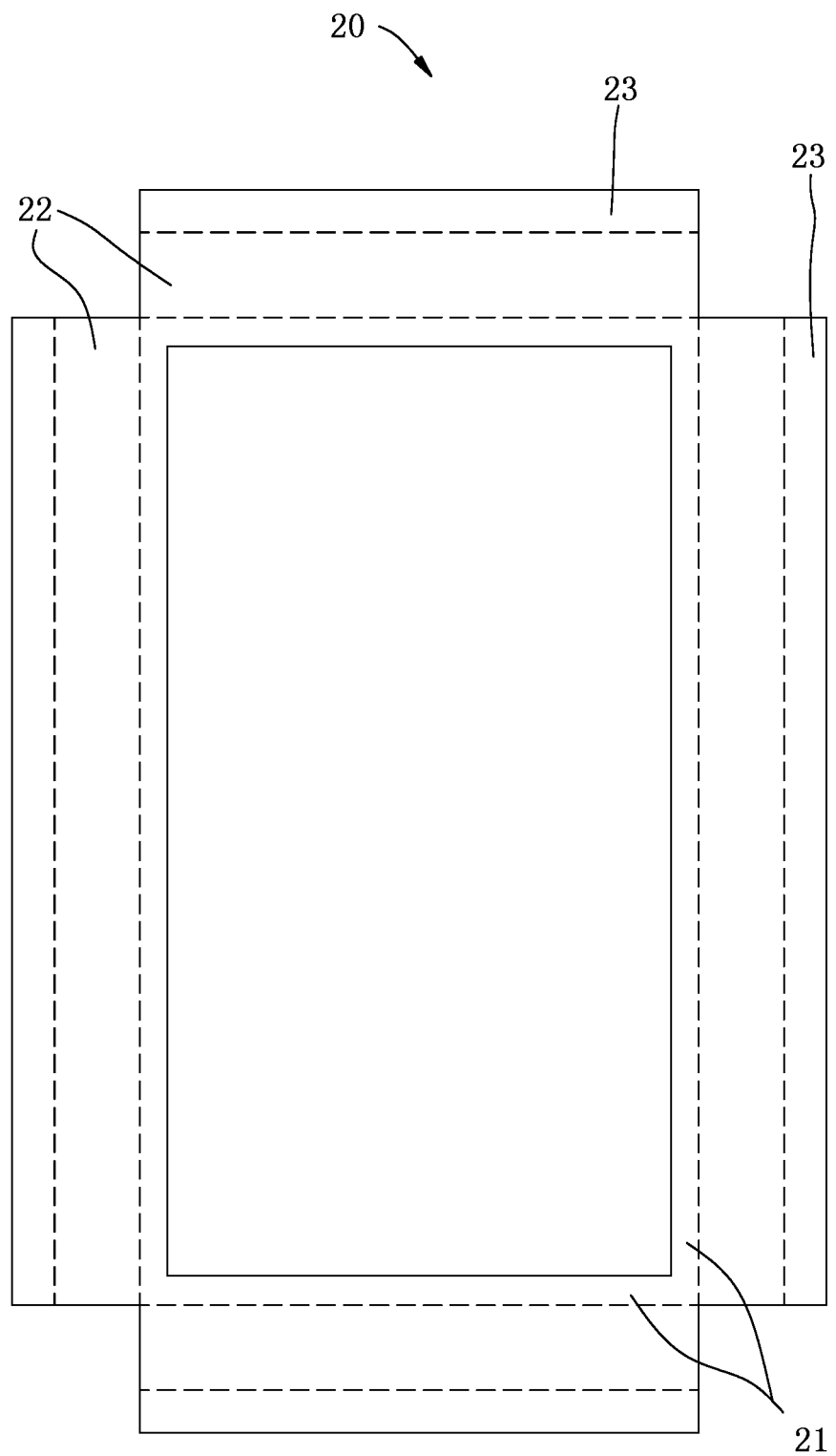
FIG. 5 is a plan view of a connector according to an embodiment of the present disclosure.
Figure 6:
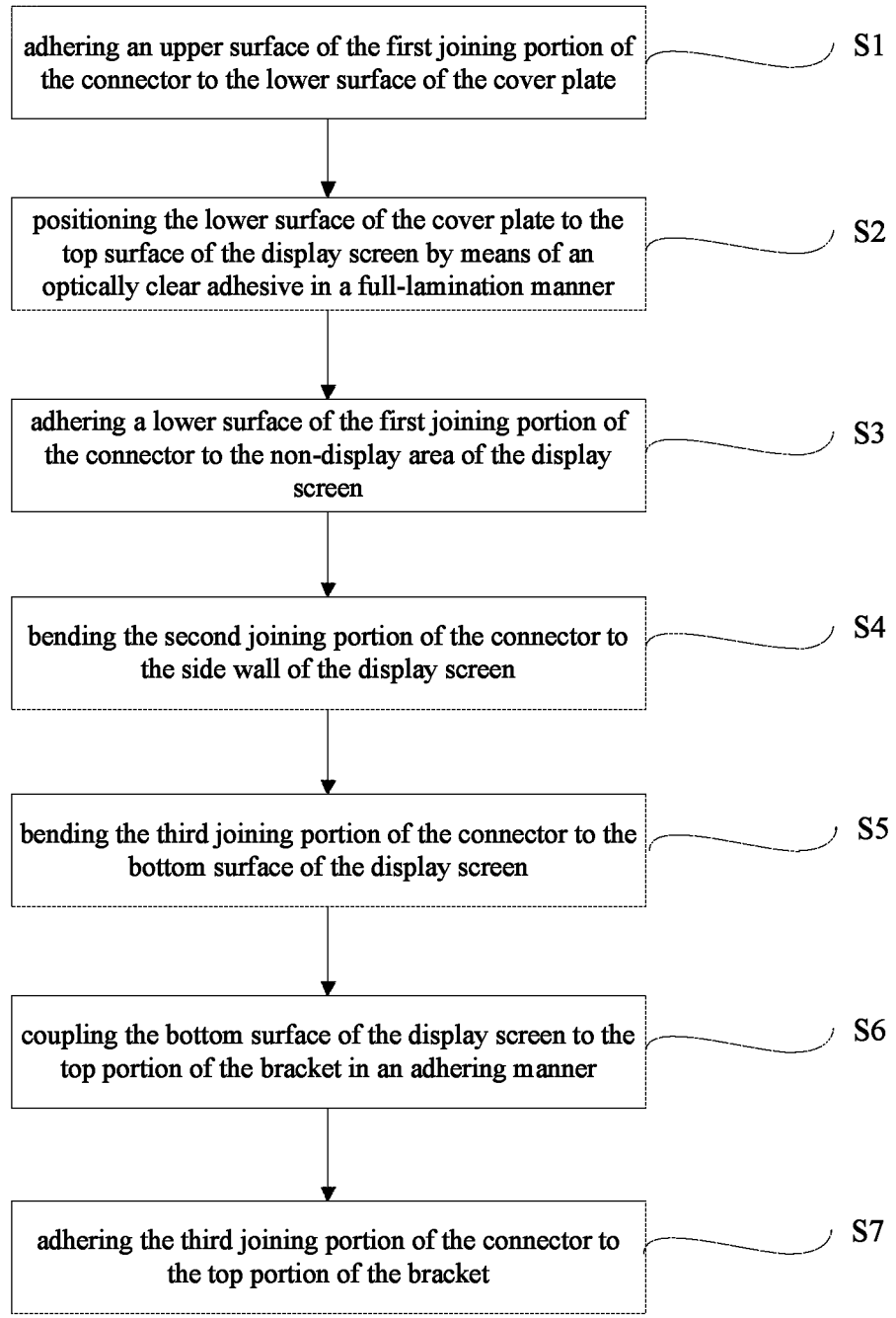
FIG. 6 is a flow chart of a method for assembling a display screen assembly according to an embodiment of the present disclosure.
Figure 7:
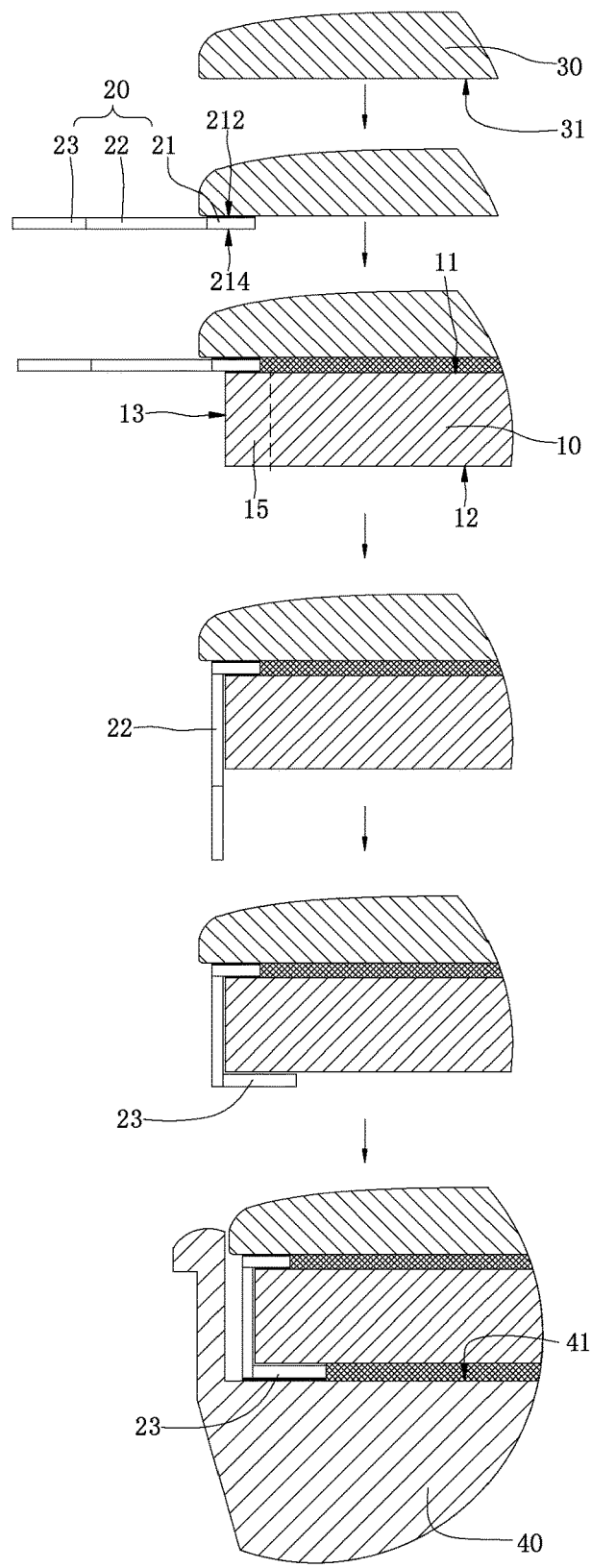
FIG. 7 is a plan view illustrating a method for assembling a display screen assembly according to an embodiment of the present disclosure.

As illustrated in FIG. 3 to FIG. 5, the connector 20 includes a first joining portion 21 having a shape of "回", a second joining portion 22 bending from four edges of the first joining portion 21, and a third joining portion 23 bending from the second joining portion 22. In some embodiments, the first joining portion 21 is in the shape of elongated "回". In other words, the first joining portion 21 has a shape of a rectangle whose central portion is removed to provide a concentric through groove. The first joining portion 21 is coupled to the top surface 11 of the display screen 10 and located in the non-display area 15 of the display screen 10, and the display area 14 is exposed out of the first joining portion 21. In an embodiment of the present disclosure, the first joining portion 21 can be coupled in the non-display area 15 of the display screen 10 by means of adhering. In some embodiments, the first joining portion 21 is not limited to being coupled on the display screen 10 by means of adhering, and the first joining portion 21 can also be coupled on the display screen 10 by means of snapping, welding or the like. The second joining portion 22 is opposite to the side wall 13 of the display screen 10, and the third joining portion 23 is closely fitted with the bottom surface 12 of the display screen 10 and corresponds to the non-display area 15. The connector 20 can be a membrane, a metal sheet, a plastic sheet or the like.

As illustrated in FIG. 4, the cover plate 30 is located in the front of the electronic device 200 and at the top surface 11 of the display screen 10. The cover plate 30 is configured as a rectangular block in shape and includes a lower surface 31. The lower surface 31 is opposite to the top surface 11 of the display screen 10, and jointed to the top surface 11 and the first joining portion 21 of the connector 20. The lower surface 31 of the cover plate 30 is positioned to the top surface 11 of the display screen 10 in a full-lamination manner. In some embodiments, the lower surface 31 of the cover plate 30 can be fully laminated to the top surface of the display screen 10 by means of an optically clear adhesive (OCA), an optical clear resin (OCR) or the like. In an embodiment of the present disclosure, the cover plate 30 is configured as a touch-screen cover plate, i.e. touch control circuits of a touch screen are integrated in the cover plate 30, and a touch function can be implemented by clicking the cover plate 30. The cover plate 30 can be made from glass, sapphire, polyvinyl chloride (PVC) or the like. In some embodiments, the cover plate 30 includes two layers of structures, namely a touch panel and a protective cover sheet arranged on the touch panel. The touch panel includes the touch control circuits of the touch screen and is configured to implement touch operations of the display screen assembly 100, and the protective cover sheet is configured to protect the touch panel from being damaged due to direct touch operations on the touch panel. In other words, the cover plate 30 serves as the touch screen with better protection thereof.

As illustrated in FIG. 4, the bracket 40 is configured to support the display screen 10, the connector 20 and the cover plate 30. The bracket 40 includes a top portion 41, and the top portion 41 has a rectangular end face. The top portion 41 is joined to the bottom surface 12 of the display screen 10 and the third joining portion 23. In an embodiment of the present disclosure, the third joining portion 23 can be coupled to the top portion 41 by means of adhering, in some embodiments by dispensing adhesive or gluing. In some embodiments, the third joining portion 23 is not limited to being coupled to the bracket 40 by means of adhering, and the third joining portion 23 can also be coupled to the bracket 40 by means of snapping, welding or the like. In some embodiments, the bracket 40 can be made of metal materials, such as steel, aluminum alloy or magnesium alloy. In an embodiment of the present disclosure, the material of the bracket 40 is steel and/or magnesium alloy. In some other embodiments, the material of the bracket 40 can also be nonmetal, such as acrylonitrile-butadiene-styrene (ABS) copolymer, polyvinyl chloride (PVC) or polycarbonate (PC). In some embodiments, the material of the bracket 40 is not limited to the above, and a proper material can be selected according to needs in practical use.

As illustrated in FIG. 4 to FIG. 7, before the display screen assembly 100 is assembled, the connector 20 presents as a planar plate structure as illustrated in FIG. 5. A method for assembling the display screen assembly 100 includes actions at following blocks.

At block S1: an upper surface 212 of the first joining portion 21 of the connector 20 is adhered to the lower surface 31 of the cover plate 30.

At block S2: the lower surface 31 of the cover plate 30 is positioned to the top surface 11 of the display screen 10 by means of an optically clear adhesive (OCA) in a full-lamination manner.

At block S3: a lower surface 214 of the first joining portion 21 of the connector 20 is adhered to the non-display area 15 of the display screen 10 and the display area 14 is exposed out of the first joining portion 21.

At block S4: the second joining portion 22 of the connector 20 is bent to the side wall 13 of the display screen 10, such that the second joining portion 22 is opposite to the side wall 13 of the display screen 10.

At block S5: the third joining portion 23 of the connector 20 is bent to the bottom surface 12 of the display screen 10, such that the third joining portion 23 corresponds to the non-display area 15. Thus, the connector 20 envelops the side wall 13 of the display screen 10 in the first joining portion 21, the second joining portion 22 and the third joining portion 23.

At block S6: the bottom surface 12 of the display screen 10 is coupled to the top portion 41 of the bracket 40 in an adhering manner.

At block S7: the third joining portion 23 of the connector 20 is adhered to the top portion 41 of the bracket 40, such that the third joining portion 23 of the connector 20 is coupled to the top portion 41 of the bracket 40.

Actions at blocks S1 to S7 are implemented in order. In other embodiments, the action at block S2 and the action at block S3 can be synchronically executed, and the action at block S6 and the action at block S7 can be synchronically executed, too. Thus, the display screen 10, the connector 20 and the cover plate 30 can be coupled to the top portion 41 of the bracket 40.

In another embodiment, as illustrated in FIG. 4 to FIG. 7, actions at blocks in the above assembling method can be executed in a following sequence: block S1, block S3, block S2, block S4, block S5, block S6 and block S7, in which the action at block S3 and the action at block S2 can be synchronically executed, and the action at block S6 and the action at block S7 can be synchronically executed, too.

In still another embodiment, as illustrated in FIG. 4 to FIG. 7, actions at blocks in the above assembling method can be executed in a following sequence: block S1, block S4, block S2, block S3, block S5, block S6 and block S7, in which the action at block S2 and the action at block S3 can be synchronically executed, and the action at block S6 and the action at block S7 can be synchronically executed, too.

In another embodiment, as illustrated in FIG. 4 to FIG. 7, actions at blocks in the above assembling method can be executed in a following sequence: block S1, block S4, block S3, block S2, block S5, block S6 and block S7, in which block S3 and block S2 can be synchronically executed, and block S6 and block S7 can be synchronically executed, too.

In another embodiment, as illustrated in FIG. 4 to FIG. 7, actions at blocks in the above assembling method can be executed in a following sequence: block S2, block S3, block S1, block S4, block S5, block S6 and block S7, in which the action at block S2 and the action at block S3 can be synchronically executed, and the action at block S6 and the action at block S7 can be synchronically executed, too.

In another embodiment, as illustrated in FIG. 4 to FIG. 7, actions at blocks in the above assembling method can be executed in a following sequence: block S2, block S3, block S4, block S1, block S5, block S6 and block S7, in which the action at block S2 and the action at block S3 can be synchronically executed, and the action at block S6 and the action at block S7 can be synchronically executed, too.

In still another embodiment, as illustrated in FIG. 4 to FIG. 7, actions at blocks in the above assembling method can be executed in a following sequence: block S3, block S4, block S1, block S2, block S5, block S6 and block S7, in which the action at block S3 and the action at block S4 can be synchronically executed, and the action at block S1 and the action at block S2 can be synchronically executed, too.

In still another embodiment, as illustrated in FIG. 4 to FIG. 7, actions at blocks in the above assembling method can be executed in a following sequence: block S3, block S4, block S5, block S1, block S2, block S6 and block S7, in which the action at block S1 and the action at block S2 can be synchronically executed, and the action at block S6 and the action at block S7 can be synchronically executed, too.

It should be understood that, the execution sequence of actions at blocks (block S1 to block S7) in the above method for assembling the display screen assembly is not limited to the sequences listed above, any other assembling methods including the above blocks (block S1 to block S7) which are executed in other different sequences fall into the protection scope of the present disclosure, as long as the assembling of the display screen assembly can be completed.

As illustrated in FIG. 3, in embodiments of the present disclosure, the electronic device 200 further includes a rear cover 50 and a battery 60. The rear cover 50 is joined with the display screen assembly 100 to form an accommodating space 202, and the battery 60 is accommodated in the accommodating space 202. In some embodiments, a connection manner between the rear cover 50 and the bracket 40 can be adhering, snapping, threaded connection or screwing.

In the electronic device 200, the display screen assembly 100 and the method for assembling the display screen assembly according to embodiments of the present disclosure, the connector 20 is used to join the cover plate 30 with the bracket 40, such that when the electronic device 200 falls down and hence has a collision or shake, the cover plate 30 pulls the display screen 10 upwards due to the collision or shake, and the connector 20 applies a downward pull force to the cover plate 30 so as to reduce an upward pull force exerted on the display screen 10 by the cover plate 30, thus preventing the display screen 10 from delamination and crack. In addition, since the first joining portion 21, the second joining portion 22 and the third joining portion 23 envelope the side wall 13 of the display screen 10 together, the delamination and crack of the display screen 10 are further restricted.

In some embodiments, an area where the first joining portion 21 of the connector 20 is adhered to the non-display area 15 of the display screen 10 is less than or equal to an area of the non-display area 15, i.e. the first joining portion 21 covers part or all of the non-display area 15. Thus, the first joining portion 21 can be prevented from shielding the display area 14 of the display screen 10, and the display screen 10 is ensured to have a large display area.

Figure 8:
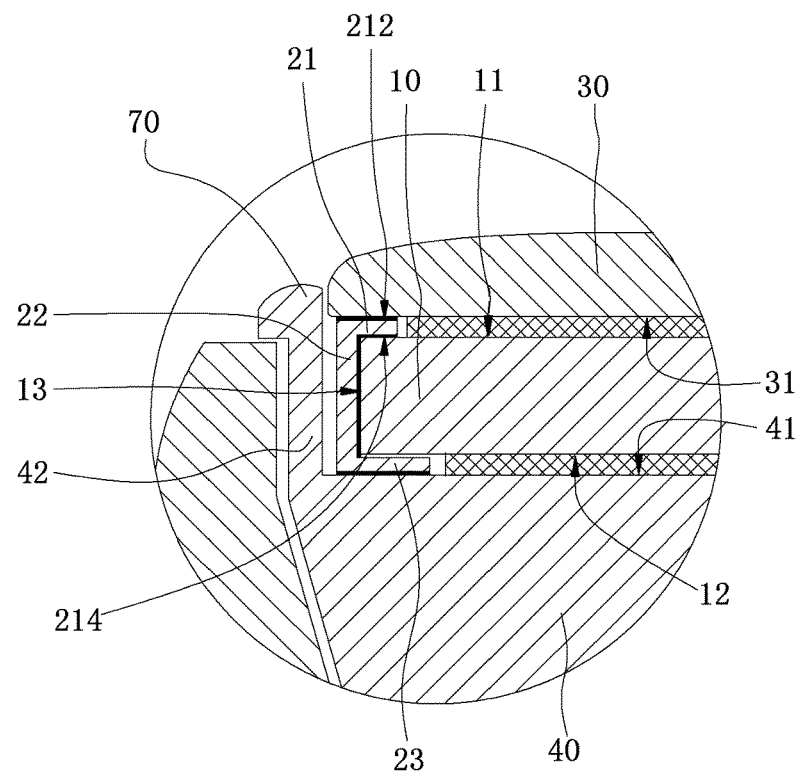
FIG. 8 is a partially enlarged view of an electronic device according to another embodiment of the present disclosure.

As illustrated in FIG. 8, in some embodiments, further, the second joining portion 22 of the connector 20 is joined to the side wall 13 of the display screen 10. In some embodiments, the second joining portion 22 is joined to the side wall 13 of the display screen 10 by adhering. In some embodiments, the second joining portion 22 is not limited to being coupled to the display screen 10 by means of adhering, and the second joining portion 22 can also be coupled to the side wall 13 of the display screen 10 by means of snapping, welding or the like. In this case, for the electronic device 200 and the display screen assembly 100, an adhesive property between the second joining portion 22 of the connector 20 and the side wall 13 of the display screen 10 further restricts the delamination and crack of the display screen 10.

Figure 9:
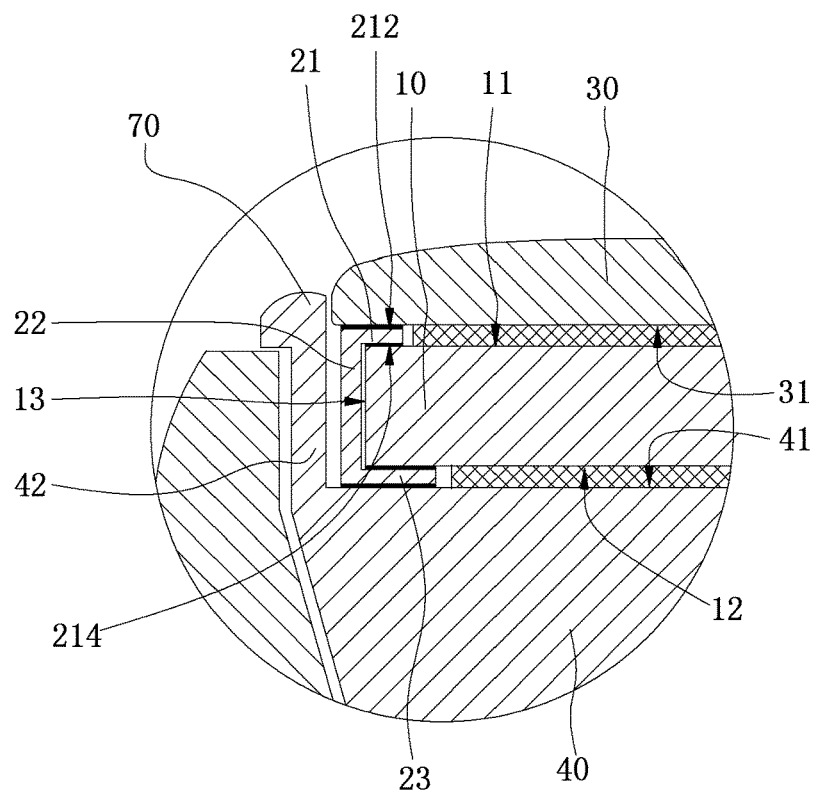
FIG. 9 is a partially enlarged view of an electronic device according to another embodiment of the present disclosure.

As illustrated in FIG. 9, in some embodiments, further, the third joining portion 23 of the connector 20 is joined to the bottom surface 12 of the display screen 10. In some embodiments, the third joining portion 23 is joined to the bottom surface 12 of the display screen 10 by means of adhering. In some embodiments, the third joining portion 23 is not limited to being coupled to the display screen 10 by means of adhering, and the third joining portion 23 can also be coupled to the bottom surface 12 of the display screen 10 by means of snapping, welding or the like.

As illustrated in FIG. 4, in some embodiments, the bracket 40 includes a side wall 42 extending upwards from an edge of the top portion 41, and the display screen assembly 100 further includes a decoration enclosure 70. The decoration enclosure 70 is arranged at a top of the side wall 42 of the bracket 40 and surrounds the cover plate 30 and the display screen 10. In some embodiments, the decoration enclosure 70 can be made of plastic, and the decoration enclosure 70 is joined with the bracket 40 by means of in-mold injection molding, in which the bracket 40 is prepared in advance. In other embodiments, the decoration enclosure 70 and the bracket 40 are integrally molded and produced to form an integral structure.

Figure 10:
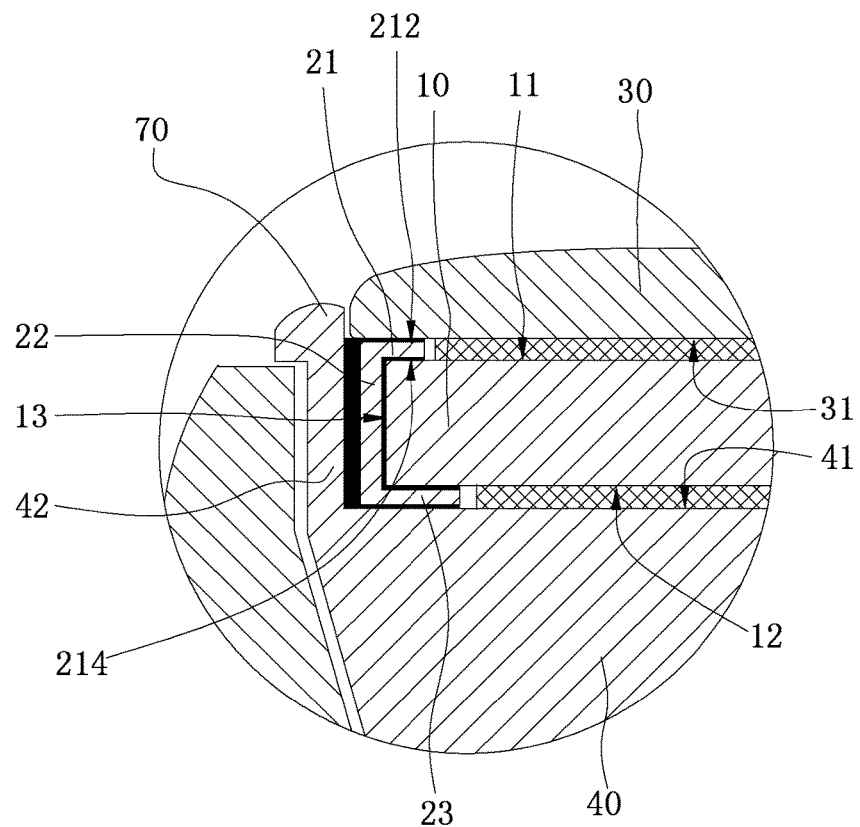
FIG. 10 is a partially enlarged view of an electronic device according to another embodiment of the present disclosure.

As illustrated in FIG. 10, in some embodiments, further, the second joining portion 22 of the connector 20 is joined to the side wall 42 of the bracket 40. In some embodiments, the second joining portion 22 is joined to the side wall 42 of the bracket 40 by means of adhering. In some embodiments, the second joining portion 22 is not limited to being coupled to the bracket 40 by means of adhering, and the second joining portion 22 can also be coupled to the side wall 42 of the bracket 40 by means of snapping, welding or the like. In this way, the connector 20 can be joined to multiple surfaces (the top surface 41 and the side wall 42) of the bracket 40, such that the connection between the connector 20 and the bracket 40 is stable. Thus, the connection between the cover plate 30 and the bracket 40 can be stable by using the connector 20, the upward pull force exerted on the display screen 20 by the cover plate 30 can be further reduced, and the delamination and crack of the display screen 10 can be further avoided.

Figure 11:
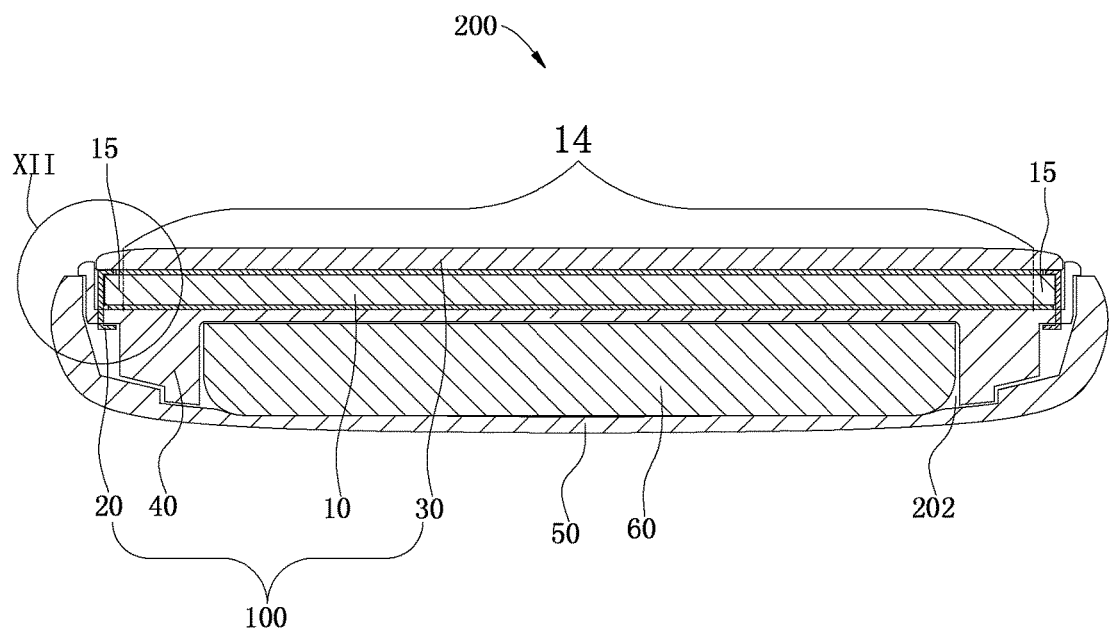
FIG. 11 is a sectional view of an electronic device according to another embodiment of the present disclosure taken along line X-X or line Y-Y in FIG. 2.
Figure 12:
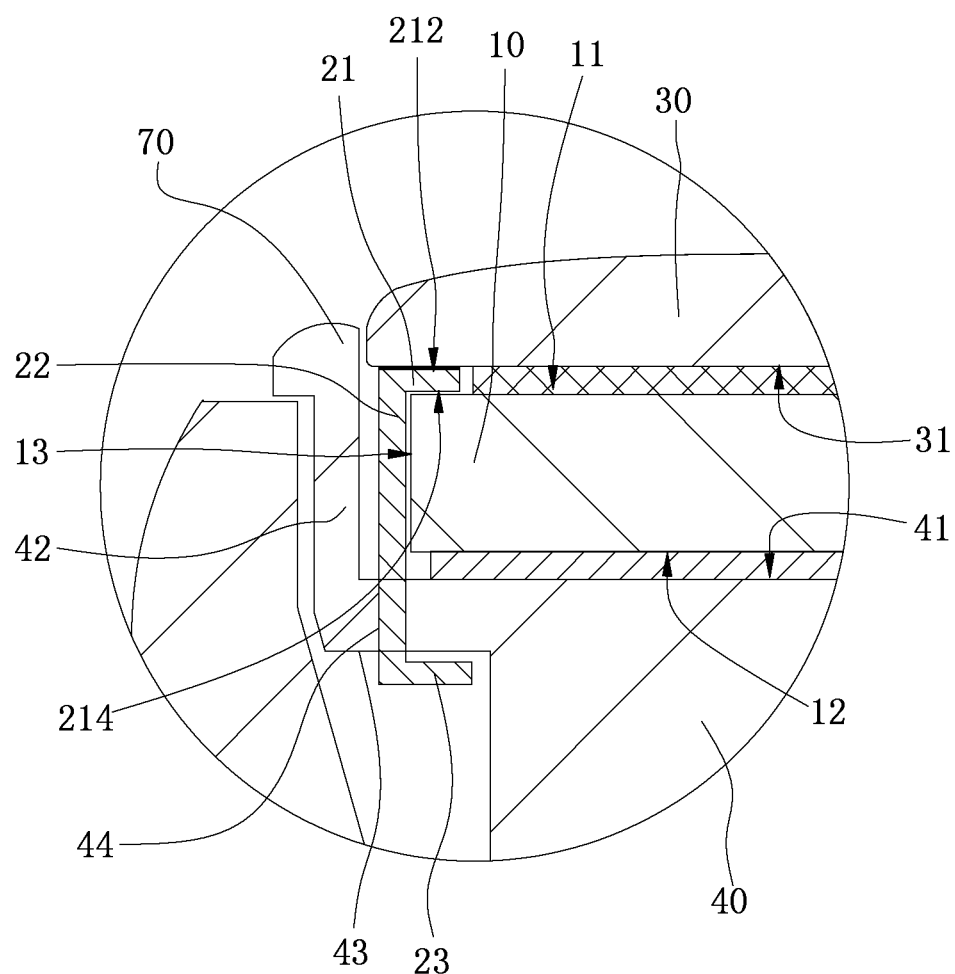
FIG. 12 is a partially enlarged view of portion XII in FIG. 11.

In some embodiments, as illustrated in FIG. 2 and FIG. 11 to FIG. 12, a sectional view illustrated in FIG. 11 can be a sectional view of the electric device 200 taken along direction X-X or direction Y-Y in FIG. 2. The display screen 10 is configured as a rectangular block in shape and includes a top surface 11, a bottom surface 12 and a side wall 13. The top surface 11 is opposite to the bottom surface 12, the side wall 13 connects the top surface 11 with the bottom surface 13, and the side wall 13 is substantially perpendicular to the top surface 11 and the bottom surface 13. The display screen 10 includes a display area 14 and a non-display area 15. The display area 14 is substantially rectangular in shape and located in middle of the top surface 11 of the display screen 10. The display area 14 is configured to display images, videos, texts or the like information. The non-display area 15 is located at a periphery of the top surface 11 of the display screen 10 and surrounds the display area 14. The non-display area 15 is in a shape of "回". In some embodiments, the non-display area 15 is in the shape of elongated "冋". In other words, the non-display area 15 has a shape of a rectangle whose central portion is removed to provide a concentric through groove.

Figure 13:
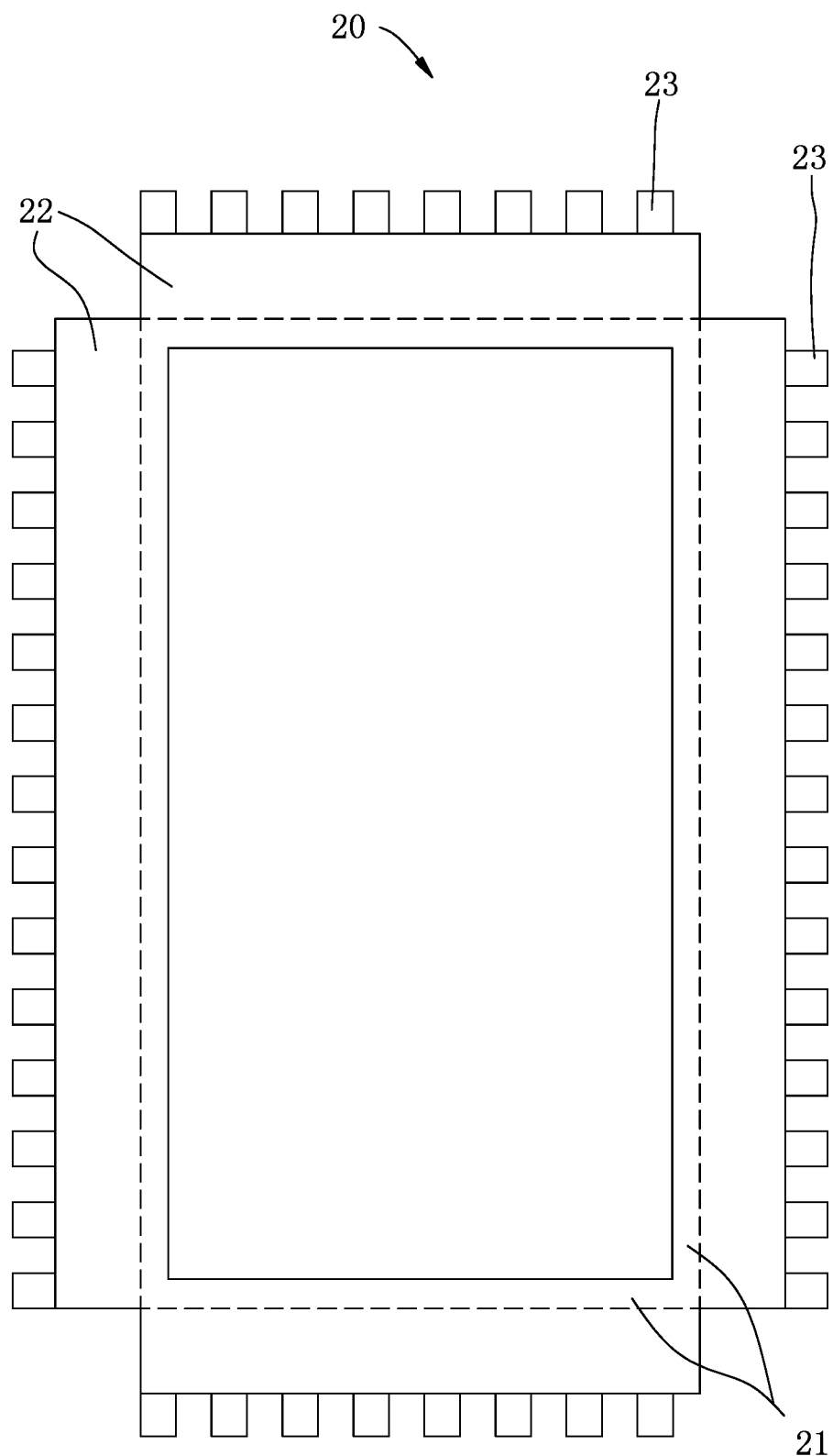
FIG. 13 is a plan view of a connector according to another embodiment of the present disclosure.
Figure 14:
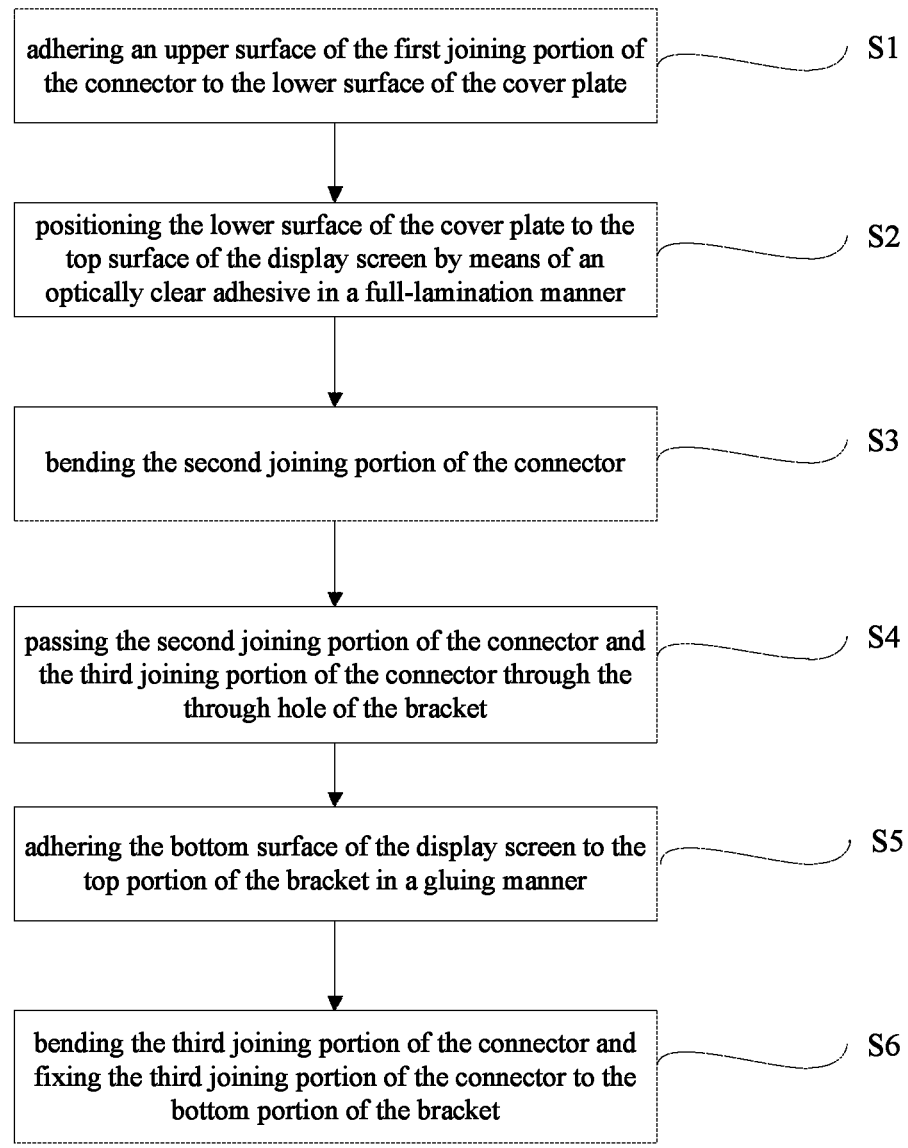
FIG. 14 is a flow chart of a method for assembling a display screen assembly according to an embodiment of the present disclosure.
Figure 15:
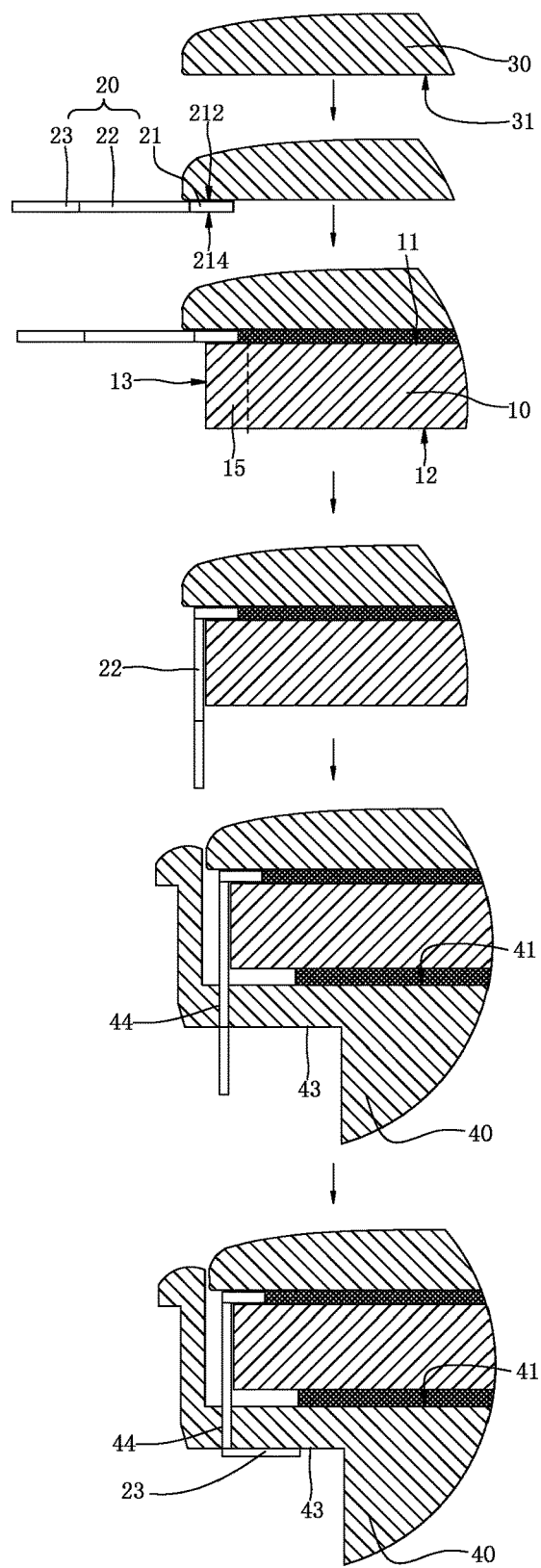
FIG. 15 is a plan view illustrating a method for assembling a display screen assembly according to an embodiment of the present disclosure.

As illustrated in FIG. 11 to FIG. 13, the connector 20 includes a first joining portion 21 having a shape of "冋", a second joining portion 22 bending from an edge of the first joining portion 21, and a third joining portion 23 bending from the second joining portion 22. In some embodiments, the first joining portion 21 is in the shape of elongated "回". In other words, the first joining portion 21 has a shape of a rectangle whose central portion is removed to provide a concentric through groove. In some embodiments, the first joining portion 21 is supported on the non-display area 15 of the display screen 10 and the display area 14 is exposed out of the first joining portion 21. The second joining portion 22 is opposite to the side wall 13 of the display screen 10. The second joining portion 22 and the third joining portion 23 can both be configured as a rectangular block in shape. In some embodiments, a cross section of the third joining portion 23 is not limited to being rectangular in shape, but can be triangular, trapezoid, oval or the like in shape. In some embodiments, the third joining portion 23 can also be configured as a claw in shape. A plurality of third joining portions 23 can be provided and spaced apart from one another, i.e. the second joining portion 22 can correspond to multiple third joining portions 23, as illustrated in FIG. 13. Or, the second joining portion 22 can correspond to the third joining portions 23 one to one, and the third joining portion 23 and the second joining portion 22 are same in length, as illustrated in FIG. 5.

As illustrated in FIG. 12, the cover plate 30 is located in the front of the electronic device 200 and at the top surface 11 of the display screen 10. The cover plate 30 is configured as a rectangular block in shape and includes a lower surface 31. The lower surface 31 is opposite to the top surface 11 of the display screen 10. The first joining portion 21 of the connector 20 is coupled to the lower surface 31 of the cover plate 30. In some embodiments, the first joining portion 21 can be coupled to the lower surface 31 of the cover plate 30 by means of any one or more of adhering, welding, threaded connection and the like. The lower surface 31 of the cover plate 30 is positioned to the top surface 11 of the display screen 10. In some embodiments, the lower surface 31 of the cover plate 30 can be fully laminated to the top surface of the display screen 10 by means of an optically clear adhesive (OCA), an optical clear resin (OCR) or the like. In an embodiment of the present disclosure, the cover plate 30 is a touch-screen cover plate, i.e. touch control circuits of a touch screen are integrated in the cover plate 30, and a touch function can be implemented by clicking the cover plate 30. The cover plate 30 can be made of glass, sapphire, polyvinyl chloride (PVC) or the like. In some embodiments, the cover plate 30 includes two layers of structures, namely a touch panel and a protective cover sheet arranged on the touch panel. The touch panel includes the touch control circuits of the touch screen and is configured to implement touch operations of the display screen assembly 100, and the protective cover sheet is configured to protect the touch panel from being damaged due to direct touch operations on the touch panel. In other words, the cover plate 30 serves as the touch screen with better protection thereof.

As illustrated in FIG. 12, the bracket 40 includes a top portion 41, a bottom portion 43 opposite to the top portion 41, and a hole 44 running through the top portion 41 and the bottom portion 43. The top portion 41 has a rectangular end surface. The top portion 41 is joined with the bottom surface 12 of the display screen 10. The second joining portion 22 of the connector 20 passes through the hole 44. The third joining portion 23 is bent and abuts against the bottom portion 43 to connect the connector 20 to the bracket 40. In some embodiments, the third joining portion 23 can be coupled to the bottom portion 43 of the bracket 40 by any one of hooking, snapping, clamping and adhering or by a combination of more than one of hooking, snapping, clamping and adhering. In some embodiments, the bracket 40 can be made of metal materials, such as steel, aluminum alloy or magnesium alloy. In some embodiments, in an embodiment of the present disclosure, the material of the bracket 40 is steel and/or magnesium alloy. In some other embodiments, the material of the bracket 40 can also be nonmetal, such as acrylonitrile-butadiene-styrene (ABS) copolymer, polyvinyl chloride (PVC) or polycarbonate (PC). In some embodiments, the material of the bracket 40 is not limited to the above, and a proper material can be selected according to needs in practical use.

As illustrated in FIG. 12 to FIG. 15, before the display screen assembly 100 in the embodiments is assembled, the connector 20 presents as a planar plate structure as illustrated in FIG. 13. A method for assembling the display screen assembly 100 includes actions at following blocks.

At block S1: an upper surface 212 of the first joining portion 21 of the connector 20 is adhered to the lower surface 31 of the cover plate 30.

At block S2: the lower surface 31 of the cover plate 30 is positioned to the top surface 11 of the display screen 10 by means of the optically clear adhesive (OCA) in a full-lamination manner.

At block S3: the second joining portion 22 of the connector 20 is bent, and in this case, the second joining portion 22 is opposite to the side wall 13 of the display screen 10.

At block S4: the second joining portion 22 of the connector 20 and the third joining portion 23 of the connector 20 pass through the hole 44 of the bracket 40.

At block S5: the bottom surface 12 of the display screen 10 is adhered to the top portion 41 of the bracket 40 in a gluing manner.

At block S6: the third joining portion 23 of the connector 20 is bent and coupled to the bottom portion 43 of the bracket 40. In some embodiments, the third joining portion 23 can be coupled to the bottom portion 43 of the bracket 40 by any one of hooking, snapping, clamping and adhering or by a combination of more than one of hooking, snapping, clamping and adhering.

Actions at blocks S1 to S6 are executed in order, and the action at block S4 and the action at block S5 can be synchronically executed. Thus, the first joining portion 21, the second joining portion 22, the third joining portion 23 and the bracket 40 together envelope the side wall 13 of the display screen 10 and allow the cover plate 30 to be connected to the bracket 40, thereby coupling the display screen 10, the connector 20 and the cover plate 30 to the top portion 41 of the bracket 40.

In other embodiments, as illustrated in FIG. 12 to FIG. 15, action at blocks in the above assembling method can be executed in a following sequence: block S1, block S3, block S2, block S4, block S5 and block S6, in which the action at block S4 and the action at block S5 can be synchronically executed.

In another embodiment, as illustrated in FIG. 12 to FIG. 15, actions at blocks in the above assembling method can be executed in a following sequence: block S3, block S1, block S2, block S4, block S5 and block S6, in which the action at block S1 and the action at block S2 can be synchronically executed, and the action at block S4 and the action at block S5 can be synchronically executed, too.

In still another embodiment, as illustrated in FIG. 12 to FIG. 15, actions at blocks in the above assembling method can be executed in a following sequence: block S5, block S1, block S3, block S2, block S4 and block S6, in which the action at block S2 and the action at block S4 can be synchronically executed.

It should be understood that, the execution sequence of the actions at blocks (block S1 to block S6) in the above method for assembling the display screen assembly is not limited to the sequences listed above, any other assembling methods including the above blocks (block S1 to block S6) which are executed in other different sequences fall into the protection scope of the present disclosure, as long as the assembling of the display screen assembly can be completed.

As illustrated in FIG. 11, in an embodiment of the present disclosure, the electronic device 200 further includes a rear cover 50 and a battery 60. The rear cover 50 is joined to the display screen assembly 100 to define an accommodating space 202, and the battery 60 is accommodated in the accommodating space 202. In some embodiments, a connection manner between the rear cover 50 and the bracket 40 can be adhering, snapping, threaded connection and screwing.

In the electronic device 200, the display screen assembly 100 and the method for assembling the display screen assembly according to embodiments of the present disclosure, the connector 20 is used to join the cover plate 30 with the bracket 40, such that when the electronic device 200 falls down and hence has a collision or shake, the cover plate 30 pulls the display screen 10 upwards due to the collision or shake, and the connector 20 applies a downward pull force to the cover plate 30 so as to reduce an upward pull force exerted on the display screen 10 by the cover plate 30, thus preventing the display screen 10 from delamination and crack. In addition, since the first joining portion 21, the second joining portion 22, the third joining portion 23 and the bracket 40 envelope the side wall 13 of the display screen 10 together, the delamination and crack of the display screen 10 are further restricted.

In some embodiments, an area where the first joining portion 21 of the connector 20 is adhered to the non-display area 15 of the display screen 10 is less than or equal to an area of the non-display area 15, i.e. the first joining portion 21 covers part or all of the non-display area 15. Thus, the first joining portion 21 can be prevented from shielding the display area 14 of the display screen 10, and the display screen 10 is ensured to have a large display area.

Figure 16:
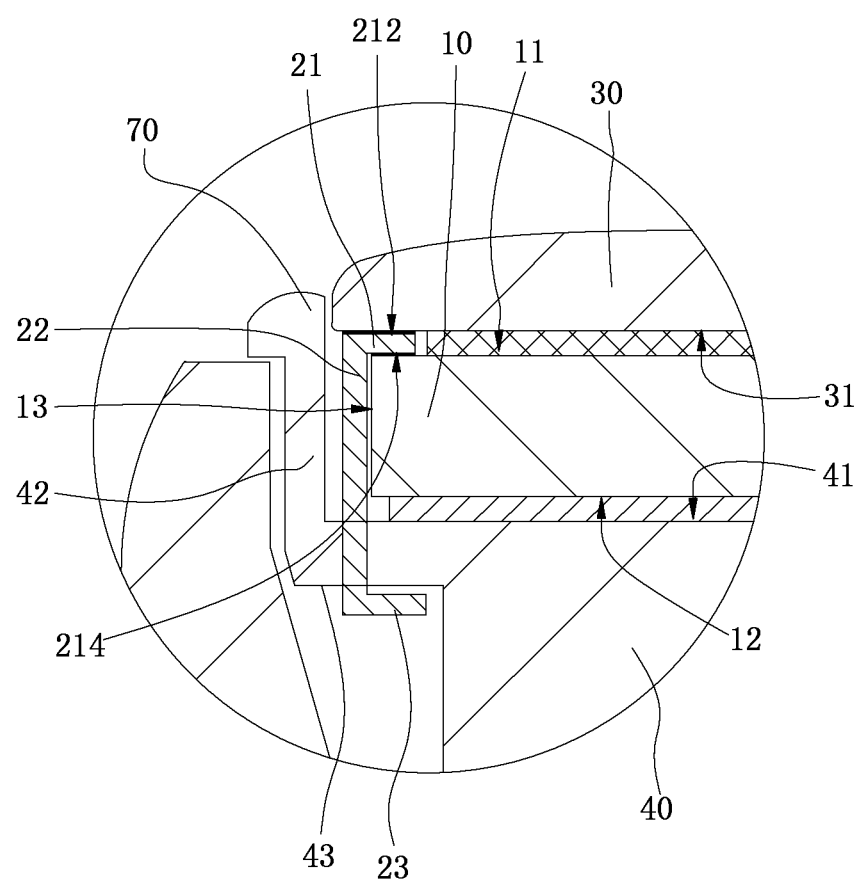
FIG. 16 is a partially enlarged view of an electronic device according to another embodiment of the present disclosure.

As illustrated in FIG. 16, in some embodiments, the first joining portion 21 of the connector 20 is joined to the top surface 11 of the display screen 10. In some embodiments, the first joining portion 21 is joined to the top surface 11 of the display screen 10 by means of adhering. In some embodiments, the first joining portion 21 is not limited to being coupled to the display screen 10 by means of adhering, and the first joining portion 21 can also be coupled to the top surface 11 of the display screen 10 by means of snapping, welding or the like.

Figure 17:
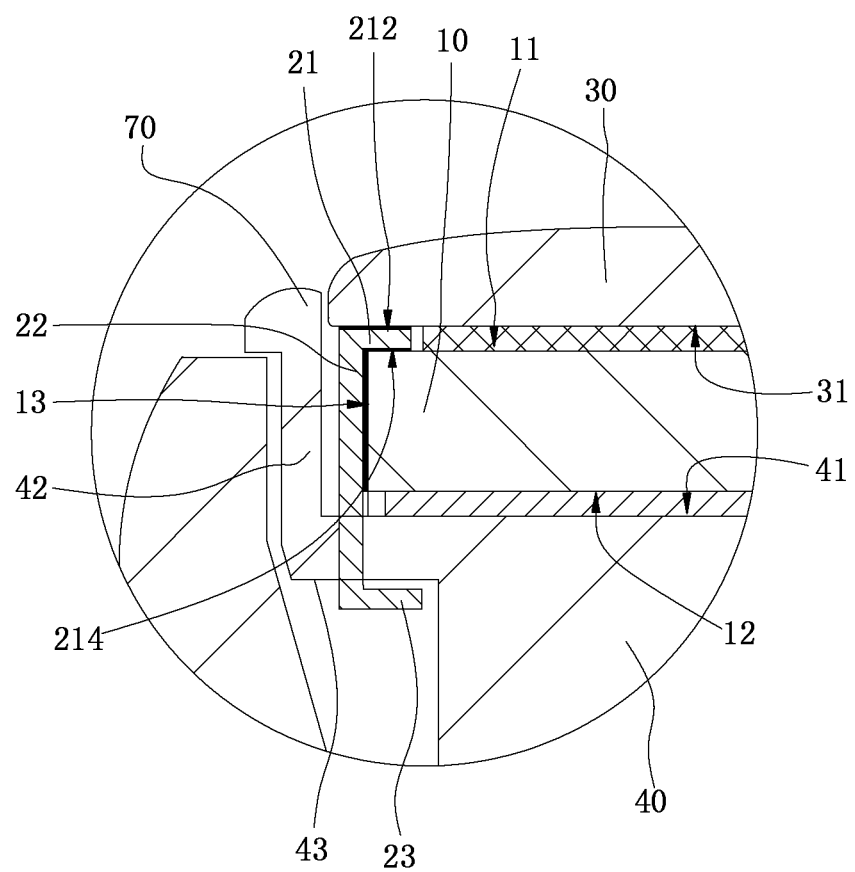
FIG. 17 is a partially enlarged view of an electronic device according to another embodiment of the present disclosure.

As illustrated in FIG. 17, in some embodiments, the second joining portion 22 of the connector 20 is joined to the side wall 13 of the display screen 10. In some embodiments, the second joining portion 22 is joined to the side wall 13 of the display screen 10 by means of adhering. In some embodiments, the second joining portion 22 is not limited to being coupled to the display screen 10 by means of adhering, and the second joining portion 22 can also be coupled to the side wall 13 of the display screen 10 by means of snapping, welding or the like. In this case, for the electronic device 200 and the display screen assembly 100, an adhesive property between the second joining portion 22 of the connector 20 and the side wall 13 of the display screen 10 further restricts the delamination and crack of the display screen 10.

As illustrated in FIG. 12, in some embodiments, the bracket 40 includes a side wall 42 extending upwards from an edge of the top portion 41, and the display screen assembly 100 further includes a decoration enclosure 70. The decoration enclosure 70 is arranged at a top of the side wall 42 of the bracket 40 and surrounds the cover plate 30 and the display screen 10. In some embodiments, the decoration enclosure 70 can be made of plastic, and the decoration enclosure 70 is joined with the bracket 40 by means of in-mold injection molding, in which the bracket 40 is prepared in advance. In other embodiments, the decoration enclosure 70 and the bracket 40 can be integrally molded and produced to form an integral structure.

Figure 18:
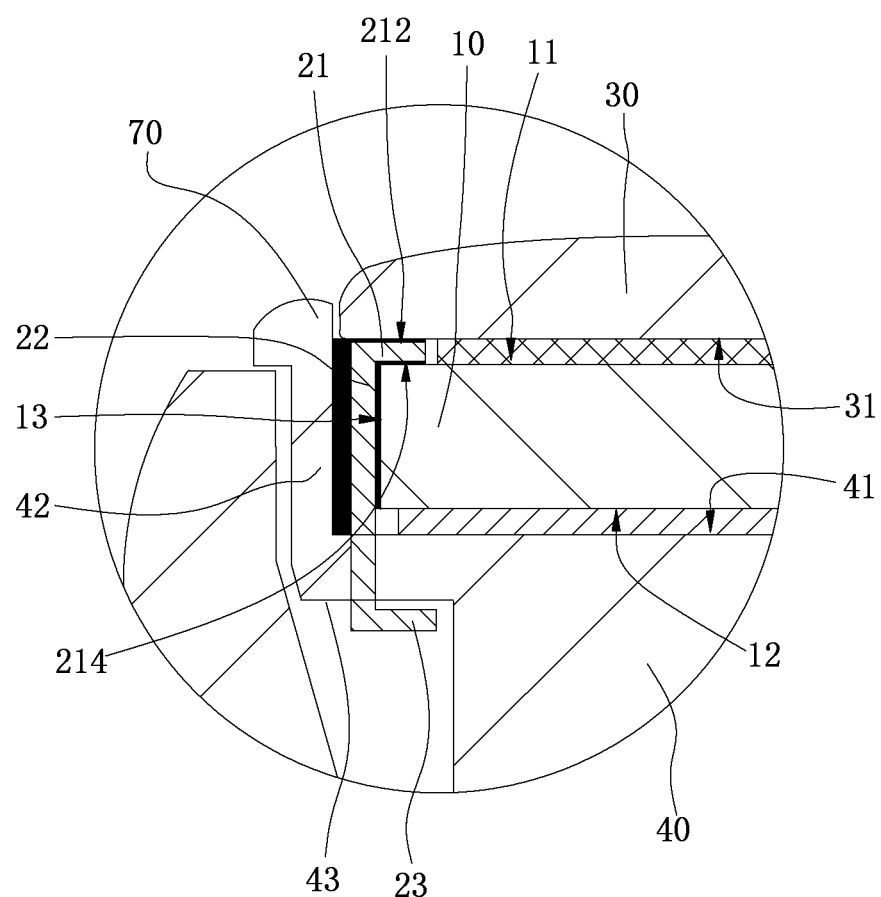
FIG. 18 is a partially enlarged view of an electronic device according to another embodiment of the present disclosure.

As illustrated in FIG. 18, in some embodiments, the second joining portion 22 of the connector 20 is joined to the side wall 42 of the bracket 40. In some embodiments, the second joining portion 22 is joined to the side wall 42 of the bracket 40 by means of adhering. In some embodiments, the second joining portion 22 is not limited to being coupled to the bracket 40 by means of adhering, and the second joining portion 22 can also be coupled to the side wall 42 of the bracket 40 by means of snapping, welding or the like. Thus, the connector 20 can be joined to multiple surfaces (the top surface 41 and the side wall 42) of the bracket 40, such that the connection between the connector 20 and the bracket 40 is stable. Thus, the connection between the cover plate 30 and the bracket 40 can be stable by using the connector 20, the upward pull force exerted on the display screen 20 by the cover plate 30 can be further reduced, and the delamination and crack of the display screen 10 can be further avoided.

Reference throughout this specification to "certain embodiment", "an embodiment", "some embodiments", "exemplary embodiment", "example", "a specific example" or "some examples", means that a particular feature, structure, material, or characteristic described in connection with the embodiment or example is included in at least one embodiment or example of the present disclosure. Thus, the above appearances of the phrases throughout this specification are not necessarily referring to the same embodiment or example of the present disclosure. Furthermore, the particular features, structures, materials, or characteristics can be combined in any suitable manner in one or more embodiments or examples.

In addition, terms such as "first" and "second" are used herein for purposes of description and are not intended to indicate or imply relative importance or significance or to imply the number of indicated technical features. Thus, the feature defined with "first" and "second" can comprise one or more of this feature. In the description of the present disclosure, the term "a plurality of" means two or more than two, unless specified otherwise.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A display screen assembly for an electronic device, comprising:
    a display screen having a display area and a non-display area surrounding the display area;
    a connector comprising a first joining portion, a second joining portion bending from an edge of the first joining portion, and a third joining portion bending from the second joining portion, the first joining portion being coupled a top surface of the display screen and located in the non-display area of the display screen, the display area being exposed out of the first joining portion, the second joining portion being opposite to a side wall of the display screen, and the third joining portion being fitted with a bottom surface of the display screen and corresponding to the non-display area;
    a cover plate having a lower surface positioned to the top surface of the display screen and to the first joining portion; and
    a bracket having a top portion joined to the bottom surface of the display screen and to the third joining portion, the bracket being coupled to a rear cover of the electronic device to define an accommodating space for accommodating a battery of the electronic device therebetween.

2. The display screen assembly according to claim 1, wherein the display screen comprises an organic light-emitting diode flexible screen.

3. The display screen assembly according to claim 1, wherein the connector comprises any one of a membrane, a metal sheet and a plastic sheet.

4. The display screen assembly according to claim 1, wherein the first joining portion is coupled in the non-display area of the display screen by means of adhering.

5. The display screen assembly according to claim 1, wherein the first joining portion covers all of the non-display area.

6. The display screen assembly according to claim 1, wherein the first joining portion covers part of the non-display area.

7. The display screen assembly according to claim 1, wherein the second joining portion is joined to the side wall of the display screen.

8. The display screen assembly according to claim 7, wherein the second joining portion is joined to the side wall of the display screen by means of adhering.

9. The display screen assembly according to claim 1, wherein the third joining portion is joined to the bottom surface of the display screen by means of adhering.

10. The display screen assembly according to claim 1, wherein the top surface of the display screen is joined to the lower surface of the cover plate in a full-lamination manner.

11. The display screen assembly according to claim 1, wherein the top surface of the display screen is adhered to the lower surface of the cover plate by means of an optically clear adhesive.

12. The display screen assembly according to claim 1, wherein the cover plate is configured as a touch-screen cover plate.

13. The display screen assembly according to claim 1, wherein the bracket comprises a side wall extending upwards from an edge of the top portion, the display screen assembly further comprises a decoration enclosure, the decoration enclosure is arranged at a top of the side wall of the bracket and surrounds the cover plate and the display screen.

14. The display screen assembly according to claim 13, wherein the decoration enclosure is joined to the bracket by means of in-mold injection molding.

15. The display screen assembly according to claim 13, wherein the decoration enclosure and the bracket are integrally molded as an integral structure.

16. A method for assembling a display screen assembly for an electronic device, comprising:
    providing a display screen, a connector, a cover plate and a bracket, the display screen having a display area and a non-display area, the connector having a first joining portion, a second joining portion and a third joining portion, and the bracket being coupled to a rear cover of the electronic device to define an accommodating space for accommodating a battery of the electronic device therebetween;
    coupling the first joining portion to a lower surface of the cover plate;
    positioning the lower surface of the cover plate to a top surface of the display screen;
    coupling the first joining portion in the non-display area of the display screen and exposing the display area out of the first joining portion;
    bending the second joining portion to a side wall of the display screen, such that the second joining portion is opposite to the side wall of the display screen;
    bending the third joining portion to a bottom surface of the display screen, such that the third joining portion is corresponding to the non-display area;
    coupling the bottom surface of the display screen to a top portion of the bracket; and
    coupling the third joining portion to the top portion of the bracket.

17. An electronic device, comprising a rear cover and a display screen assembly coupled to the rear cover to define an accommodating space therebetween, wherein the display screen assembly comprises:
    a display screen having a display area and a non-display area;
    a connector having a first joining portion, a second joining portion bending from an edge of the first joining portion, and a third joining portion bending from the second joining portion, the first joining portion being coupled in the non-display area of the display screen, the second joining portion being opposite to a side wall of the display screen, and the third joining portion being fitted with a bottom surface of the display screen and corresponding to the non-display area;
    a cover plate having a lower surface positioned to a top surface of the display screen and to the first joining portion; and
    a bracket having a top portion joined to the bottom surface of the display screen and to the third joining portion, the bracket being coupled to the rear cover of the electronic device to define the accommodating space for accommodating a battery of the electronic device.

18. The electronic device according to claim 17, wherein the rear cover is coupled to the bracket by at least one of adhering, snapping, threaded connection and screwing.

19. The electronic device according to claim 17, wherein the cover plate is configured as a touch-screen cover plate and comprises:
a touch panel having a touch control circuit and configured to achieve a touch operation of the display screen assembly; and
a protective cover sheet provided on the touch panel and configured to protect the touch panel from being damaged due to direct touch operations on the touch panel.

* * * * *